United States Patent
Si et al.

(10) Patent No.: US 9,887,122 B2
(45) Date of Patent: Feb. 6, 2018

(54) METHOD AND APPARATUS FOR PROCESSING WAFER-SHAPED ARTICLES

(71) Applicant: LAM RESEARCH AG, Villach (AT)

(72) Inventors: Hongbo Si, Villach (AT); Bhaskar Bandarapu, Villach (AT); Andreas Gleissner, Dobriach (AT); Bernhard Loidl, Villach (AT)

(73) Assignee: LAM RESEARCH AG, Villach (AT)

( * ) Notice: Subject to any disclaimer, the term of this patent is extended or adjusted under 35 U.S.C. 154(b) by 0 days.

(21) Appl. No.: 15/148,778

(22) Filed: May 6, 2016

(65) Prior Publication Data

US 2017/0323823 A1 Nov. 9, 2017

(51) Int. Cl.
| | |
|---|---|
| *H01L 21/687* | (2006.01) |
| *H01L 21/67* | (2006.01) |
| *B05C 13/00* | (2006.01) |
| G03F 7/16 | (2006.01) |
| B05C 9/14 | (2006.01) |
| B05C 5/02 | (2006.01) |

(52) U.S. Cl.
CPC ........ *H01L 21/68785* (2013.01); *B05C 13/00* (2013.01); *H01L 21/6708* (2013.01); *H01L 21/67051* (2013.01); *H01L 21/67115* (2013.01); *B05C 5/0208* (2013.01); *B05C 9/14* (2013.01); *G03F 7/162* (2013.01); *G03F 7/168* (2013.01); *H01L 21/67178* (2013.01); *Y10S 134/902* (2013.01)

(58) Field of Classification Search
CPC ..... B05C 13/00; B05C 5/0204; B05C 5/0208; H01L 21/68785; H01L 21/67051; H01L 21/67115; H01L 21/6708; H01L 21/67017; H01L 21/67178; G03F 7/162; G03F 7/168; Y10S 134/902
USPC ............ 156/345.23, 345.21, 345.51, 345.52; 134/104.2, 157, 95.1, 95.2, 95.3, 99.1, 134/102.1, 102.2, 102.3, 902; 118/50, 52, 118/56, 319, 320, 500
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,485,531 B1 | 11/2002 | Schob | |
| 6,793,769 B2 * | 9/2004 | Kajino | C03C 15/00 134/33 |
| 7,811,412 B2 * | 10/2010 | Miya | H01L 21/67017 118/730 |
| 7,891,314 B2 | 2/2011 | Pichler | |

(Continued)

FOREIGN PATENT DOCUMENTS

| | | |
|---|---|---|
| WO | 2006/008236 A1 | 1/2006 |
| WO | 2007/101764 A1 | 9/2007 |

*Primary Examiner* — Laura Edwards (57) ABSTRACT

In an apparatus for treating a wafer-shaped article, a spin chuck is configured to hold a wafer-shaped article of a predetermined diameter. A non-rotating plate is positioned relative to the spin chuck such that the non-rotating plate is beneath and parallel to a wafer-shaped article when positioned on the spin chuck. A fluid dispensing nozzle passes through the non-rotating plate and terminates in a discharge end positioned above and adjacent to the non-rotating plate. The discharge end comprises a horizontal gas discharge nozzle configured to distribute gas radially outwardly across an upper surface of the non-rotating plate.

37 Claims, 3 Drawing Sheets

(56) References Cited

U.S. PATENT DOCUMENTS

| | | | | |
|---|---|---|---|---|
| 8,361,234 B2* | 1/2013 | Izuta | ............... | H01L 21/67051 |
| | | | | 118/715 |
| 8,485,204 B2* | 7/2013 | Obweger | .......... | H01L 21/68721 |
| | | | | 134/104.2 |
| 2008/0110861 A1* | 5/2008 | Kajita | .................... | B08B 3/02 |
| | | | | 216/83 |
| 2009/0079122 A1* | 3/2009 | Obweger | .......... | H01L 21/67051 |
| | | | | 269/57 |

\* cited by examiner

METHOD AND APPARATUS FOR PROCESSING WAFER-SHAPED ARTICLES

BACKGROUND OF THE INVENTION

1. Field of the Invention

The invention relates generally to a method and apparatus for processing wafer-shaped articles, such as semiconductor wafers, in a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

Radiant heaters used in such chucks often include a plate that is transparent to the radiation. A plate may also be useful for shielding other components of the chuck from the processing chemicals used.

The present inventors have discovered that such plates can accumulate deposits during processing of wafer-shaped articles, for example during photoresist removal. When the plate is thus contaminated, it no longer transits heat evenly, which can affect the performance of the chuck during wafer processing.

In greater detail, the present inventors have discovered that a limitation of closed chamber technology for certain single-wafer cleaning processes is that contamination from polymer deposition has been observed on the non-rotating quartz window that covers the radiant heating assembly. For example, such contamination has been observed when performing photoresist removal at elevated temperatures. Contamination from polymer deposition is observed after running several hundred wafers. The deposited polymer changes the transparency of the quartz window and affects on-wafer performance due to temperature drift. Periodic cleaning of the quartz plate is an undesired option as it leads to throughput reduction.

As such, to overcome this problem, a new concept has been developed to effectively purge inert gas over the entire quartz window. This not only protects the plate from being contaminated but also helps maintain the uniform temperature on wafer. Additionally, the back-side dispense of cooling gas combined with top side will effectively cool the wafer in a subsequent cooling step and also purge out process gas.

By contrast, current closed chamber technology has backside gas dispensed directly pointing to the wafer center. The disadvantage of this technology is that not only does it cool the wafer at its center undesirably during the hot process step, but also it also drags the volatile polymer byproducts from the wafer surface to the quartz window. This leads to contamination of the quartz window and temperature drift which affects on wafer performance.

SUMMARY OF THE INVENTION

Thus, in one aspect, the present invention relates to an apparatus for treating a wafer-shaped article, comprising a spin chuck configured to hold a wafer-shaped article of a predetermined diameter in a predetermined horizontal position. A non-rotating plate is positioned relative to the spin chuck such that the non-rotating plate is beneath and parallel to a wafer-shaped article when positioned on the spin chuck in the predetermined horizontal position. A fluid dispensing nozzle passes through the non-rotating plate and terminates in a discharge end positioned above and adjacent to the non-rotating plate. The discharge end comprises a horizontal gas discharge nozzle configured to distribute gas radially outwardly across an upper surface of the non-rotating plate.

In preferred embodiments of the present invention, a liquid dispense nozzle is directed to the upper surface of the wafer-shaped article.

In preferred embodiments of the apparatus according to the present invention, the apparatus further comprises a chamber that can be closed in an airtight manner, the spin chuck, the non-rotating plate and the fluid dispensing nozzle being disposed within the chamber.

In preferred embodiments of the apparatus according to the present invention, the spin chuck is an annular magnetic rotor comprising downwardly-projecting gripping pins configured to hold a wafer-shaped article such that it hangs downwardly from the annular magnetic rotor.

In preferred embodiments of the apparatus according to the present invention, the chamber comprises an upper section and a lower section that is movable vertically relative to the upper section between a first position in which the upper and lower sections are spaced apart from one another, and a second position in which the upper and lower sections sealingly engage one another.

In preferred embodiments of the apparatus according to the present invention, the annular magnetic rotor is positioned in the upper section of the chamber and the non-rotating plate and the fluid dispensing nozzle are positioned in the lower section of the chamber.

In preferred embodiments of the apparatus according to the present invention, the spin chuck is mounted for rotation about a stationary central post and comprises a series of upwardly-projecting gripping pins configured to hold a wafer-shaped article in the predetermined horizontal position above an upper surface of the spin chuck; the non-rotating plate being mounted on the central stationary post above the upper surface of the spin chuck and below a wafer-shaped article when held in the predetermined horizontal position.

In preferred embodiments of the apparatus according to the present invention, the non-rotating plate is an upper cover of a heating assembly comprises at least one radiant heating element.

In preferred embodiments of the apparatus according to the present invention, the heating assembly comprises at least one infrared heating element.

In preferred embodiments of the apparatus according to the present invention, the heating assembly comprises a plurality of LED heating elements.

In preferred embodiments of the apparatus according to the present invention, the non-rotating plate is substantially transparent to radiation emitted by the at least one radiant heating element.

In preferred embodiments of the apparatus according to the present invention, the non-rotating plate is made from quartz.

In preferred embodiments of the apparatus according to the present invention, the horizontal gas discharge nozzle comprises an annular gas dispensing orifice that opens adjacent the non-rotating plate, whereby gas ejected from the annular gas dispensing orifice is directed radially outwardly.

In preferred embodiments of the apparatus according to the present invention, the horizontal gas discharge nozzle further comprises a radially-outwardly extending annular shoulder that overlies the annular gas dispensing orifice, whereby gas ejected from the annular gas dispensing orifice is deflected horizontally and radially outwardly by the radially-outwardly extending annular shoulder.

In preferred embodiments of the apparatus according to the present invention, the fluid dispensing nozzle further comprising at least one vertical fluid discharge nozzle for directing another fluid against a wafer-shaped article when held by the spin chuck.

In preferred embodiments of the apparatus according to the present invention, the at least one vertical fluid discharge nozzle comprises a vertical gas discharge nozzle communicating with a gas supply and a vertical liquid discharge nozzle communicating with a liquid supply.

In preferred embodiments of the apparatus according to the present invention, the at least one vertical fluid discharge nozzle has a discharge orifice positioned above the horizontal gas discharge nozzle.

In preferred embodiments of the apparatus according to the present invention, a supply of inert gas is connected to the fluid dispensing nozzle and feeds the horizontal gas discharge nozzle.

In preferred embodiments of the apparatus according to the present invention, the horizontal gas discharge nozzle comprises a radially outwardly directed annular slit for providing a gas curtain into a gap between the non-rotating plate and a wafer-shaped article when positioned on the spin chuck, in a direction parallel to the non-rotating plate.

In preferred embodiments of the apparatus according to the present invention, the predetermined horizontal position is such that a lower surface of a wafer-shaped article when positioned on the spin chuck is spaced from an upper surface of the non-rotating plate by a distance of 1-20 mm.

In preferred embodiments of the apparatus according to the present invention, the non-rotating plate is round and positioned coaxially with a wafer-shaped article when held by the spin chuck, the non-rotating plate having a diameter of at least 90% of the predetermined diameter.

In preferred embodiments of the apparatus according to the present invention, the horizontal gas discharge nozzle has a diameter of less than 20 mm.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
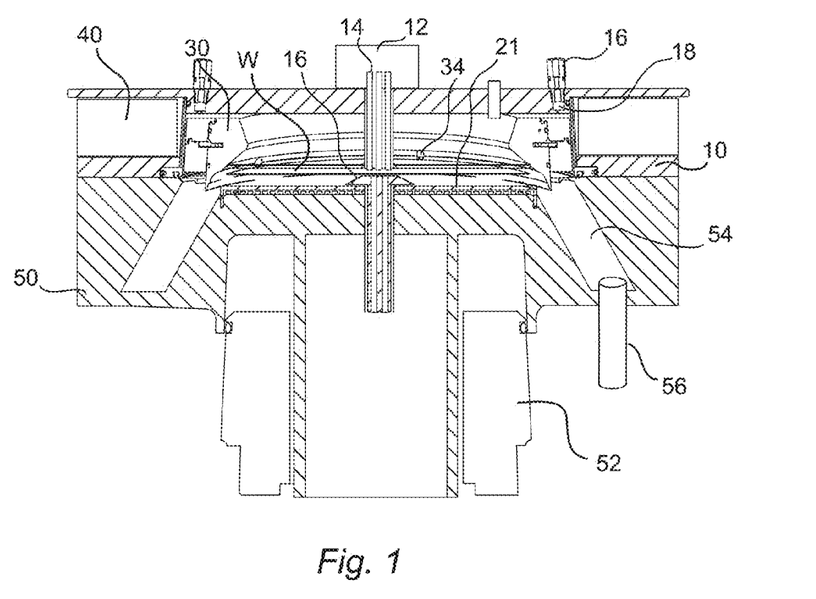
FIG. 1 is an explanatory cross-sectional side view of an apparatus according to a first embodiment of the invention, in its operating position.

Referring now to FIG. 1, upper chamber part 10 and lower chamber part 50 are joined together and a wafer W is held by the rotary chuck 30. Chuck 30 in this embodiment is a magnetic ring rotor, which is driven in rotation via a stator 40 mounted outside the chamber, and on the upper chamber part 10. Stator 40 also maintains magnetic rotor 30 suspended within the upper chamber part 10, without contact between the rotor 30 and upper chamber part 10.

The rotor 30 and stator 40 serve as a motor by which the ring rotor 30 (and thereby a supported wafer W) may be rotated through an active magnetic bearing. For example, the stator 40 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

Wafer W depends downwardly from the ring rotor chuck 30, and is held by a circular series of gripping pins 34 that project downwardly from the rotor ring 30, in a manner known per se.

Process gases and/or liquids can be supplied to the upwardly facing side of wafer W via manifold 12 and one or more conduits 14, which pass through a central opening in a guard plate 32 so as to open above the wafer W.

Lower chamber part 50 is equipped with a heating assembly 21 which in this embodiment is an array of blue LED elements covered by a plate 22 that is substantially transparent to the radiation emitted by the LED elements, for example a quartz plate. Heating assembly 21 preferably emits radiation having a maximum intensity in a wavelength range from 390 nm to 550 nm, more preferably from 400 nm to 500 nm.

Lower chamber part 50 moves vertically on a stationary support frame 52 to permit the chamber to be opened and closed. Annular duct 54 surrounds the chuck 30, and communicates with a discharge conduit 56.

Lower chamber part 50 also includes a fluid dispensing nozzle 16 that passes through the non-rotating plate 22 and terminates in a discharge end positioned above and adjacent to the non-rotating plate. The discharge end comprises a horizontal gas discharge nozzle configured to distribute gas radially outwardly across an upper surface of the non-rotating plate, as will be described in greater detail below.

Figure 2:
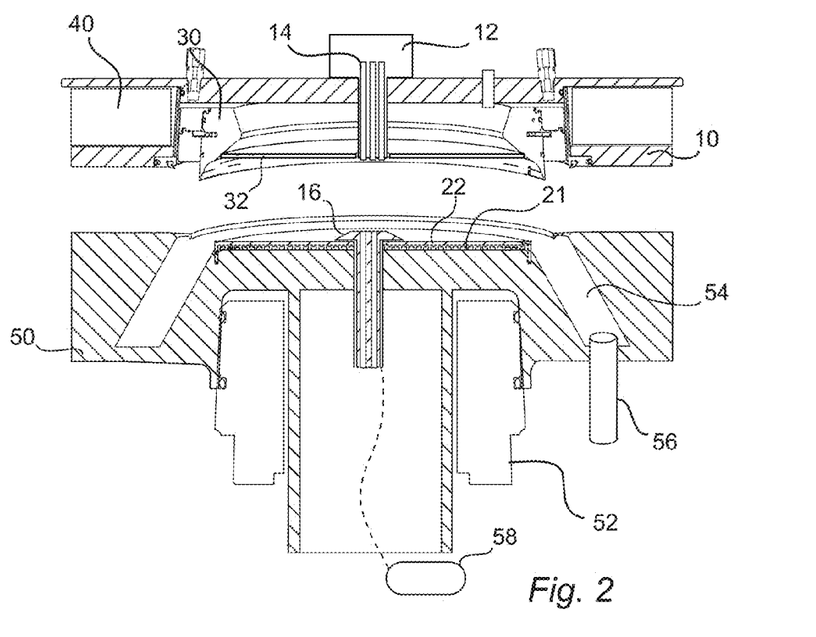
FIG. 2 is an explanatory cross-sectional side view of an apparatus according to the first embodiment of the invention, in its loading and unloading position.

In FIG. 2, the lower chamber part 50 has been displaced downwardly in relation to the upper chamber part 10, so as to allow loading and unloading of a wafer W. Also shown schematically in FIG. 2 is a source 58 of inert gas, such as nitrogen, supplying the horizontal gas discharge nozzle.

Chuck 30 is designed to hold a single wafer of a predetermined diameter. For example, silicon wafers used to fabricate semiconductor devices are currently 300 mm or 450 mm.

Figure 3:
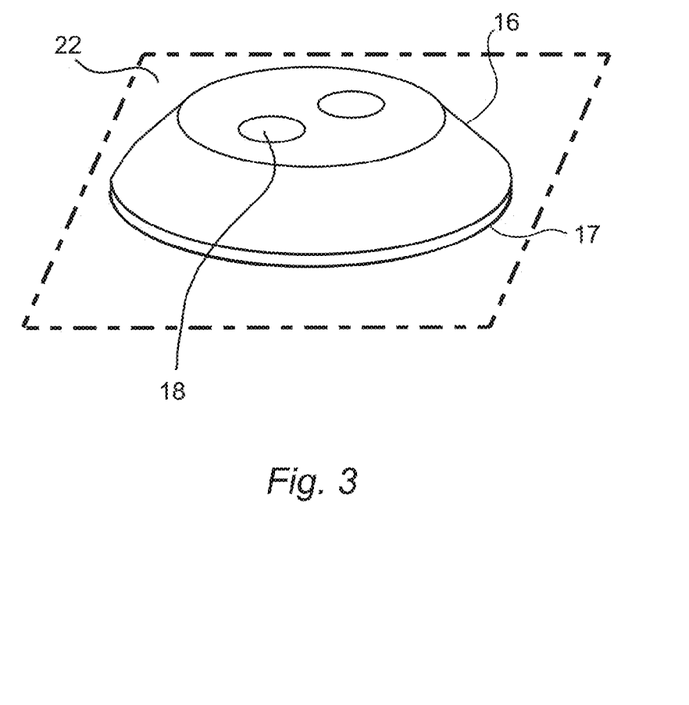
FIG. 3 is a fragmentary perspective view of the fluid dispensing nozzle of the embodiment of FIGS. 1 and 2.
Figure 4:
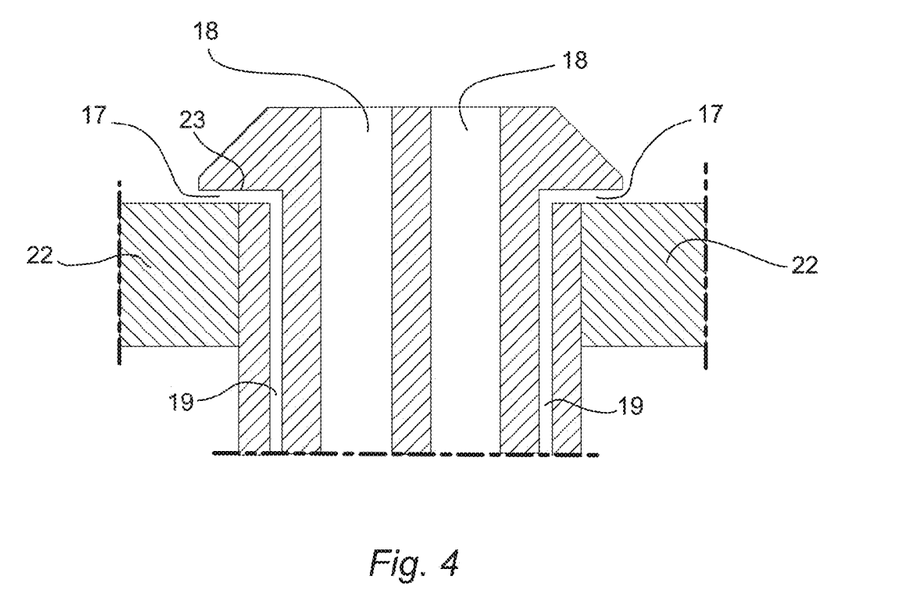
FIG. 4 is an enlarged view of discharge end of the fluid nozzle in FIG. 1.

Referring now to FIG. 3, it can be seen that the part of nozzle 16 that is positioned above the plate 22 includes three discharge nozzles, namely, two nozzles 18 that impinge directly on the facing side of a wafer W, and a horizontal discharge nozzle 17. As shown in FIG. 4, the nozzle 16 passes through plate 22 and then widens to form the horizontal discharge nozzle 17. The radially outwardly projecting shoulder 23 aids in directing inert gas fed through annular channel 19 horizontally across the surface of plate 22.

Whereas nozzles 18 are continuous bores in the nozzle 16, the horizontal discharge nozzle is fed by an annular passageway 19.

Figure 5:
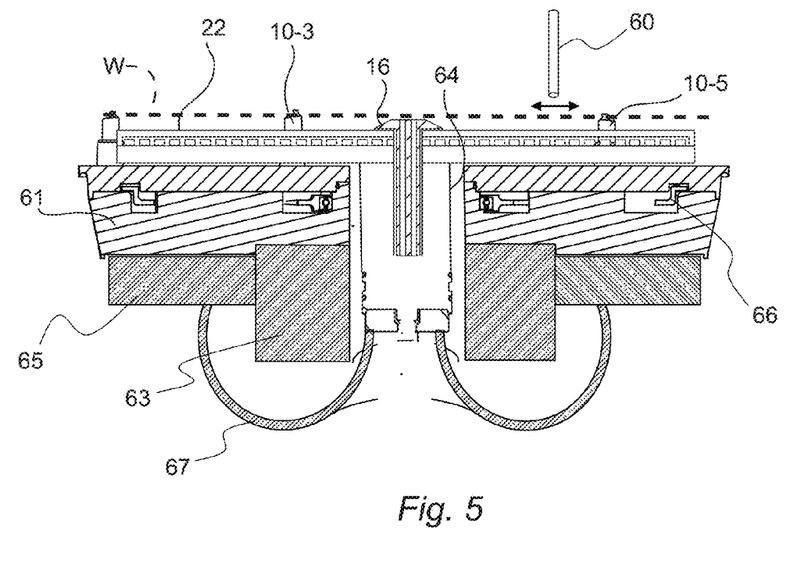
FIG. 5 is an explanatory cross-sectional side view of an apparatus according to another embodiment of the invention.

In FIG. 5, the fluid dispensing nozzle 16 is shown applied to a spin chuck in which the chuck body is driven by a motor. Spin chuck 61 is mounted to the rotor of a hollow-shaft motor 63 (schematically shown in FIG. 5), and the nozzle 16 and heating assembly 21 are mounted on a stationary central post 64 about which the chuck body 61 is driven in rotation. The stator of the hollow-shaft motor 63 is mounted to the mounting plate 65 (schematically shown in FIG. 5). Post 64 and mounting plate 65 are mounted to the same stationary frame 67 (schematically shown in FIG. 5).

Gripping elements 10-1 to 10-6 are provided with eccentrically mounted grippers. The gripping elements are conjointly rotated about their cylindrical axes by a ring gear 66 that is in meshing engaging with all of the gripping elements. The eccentric grippers are thus moved in concert between a radially inner closed position in which a wafer W is secured, to a radially outer open position in which the wafer W is released.

An upper liquid dispenser 60 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 60 is preferably displaceable radially of the wafer W, to aid in spreading treatment liquid over the entire upwardly facing surface of wafer W as it is rotated on the spin chuck.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for treating a wafer-shaped article, comprising:
    a spin chuck configured to hold a wafer-shaped article of a predetermined diameter in a predetermined horizontal position;
    a non-rotating plate positioned relative to said spin chuck such that said non-rotating plate is beneath and parallel to the wafer-shaped article when positioned on said spin chuck in said predetermined horizontal position; and
    a fluid dispensing nozzle passing through said non-rotating plate and terminating in a discharge end positioned above and adjacent to said non-rotating plate; said discharge end comprising a horizontal gas discharge nozzle configured to distribute gas radially outwardly across an upper surface of said non-rotating plate,
    wherein said horizontal gas discharge nozzle comprises an annular gas dispensing orifice that opens adjacent to said non-rotating plate, whereby gas ejected from said annular gas dispensing orifice is directed radially outwardly, and
    wherein said horizontal gas discharge nozzle further comprises a radially-outwardly extending annular shoulder that overlies said annular gas dispensing orifice, whereby gas elected from said annular qas dispensing orifice is deflected horizontally and radially outwardly by said radially-outwardly extending annular shoulder.

2. The apparatus according to claim 1, further comprising a chamber that can be closed in an airtight manner, said spin chuck, said non-rotating plate and said fluid dispensing nozzle being disposed within said chamber.

3. The apparatus according to claim 2, wherein said spin chuck is an annular magnetic rotor comprising downwardly-projecting gripping pins configured to hold a wafer-shaped article such that it hangs downwardly from said annular magnetic rotor.

4. The apparatus according to claim 3, wherein said chamber comprises an upper section and a lower section that is movable vertically relative to said upper section between a first position in which said upper and lower sections are spaced apart from one another, and a second position in which said upper and lower sections sealingly engage one another.

5. The apparatus according to claim 4, wherein said annular magnetic rotor is positioned in said upper section of said chamber and said non-rotating plate and said fluid dispensing nozzle are positioned in said lower section of said chamber.

6. The apparatus according to claim 1, wherein said spin chuck is mounted for rotation about a stationary central post and comprises a series of upwardly-projecting gripping pins configured to hold a wafer-shaped article in said predetermined horizontal position above an upper surface of said spin chuck; said non-rotating plate being mounted on said central stationary post above said upper surface of said spin chuck and below a wafer-shaped article when held in said predetermined horizontal position.

7. The apparatus according to claim 1, wherein said non-rotating plate is an upper cover of a heating assembly and comprises at least one radiant heating element.

8. The apparatus according to claim 7, wherein said heating assembly comprises at least one infrared heating element.

9. The apparatus according to claim 7, wherein said heating assembly comprises a plurality of LED heating elements.

10. The apparatus according to claim 7, wherein said non-rotating plate is substantially transparent to radiation emitted by said at least one radiant heating element.

11. The apparatus according to claim 10, wherein said non-rotating plate is made from quartz.

12. The apparatus according to claim 1, wherein said fluid dispensing nozzle further comprising at least one vertical fluid discharge nozzle for directing another fluid against a wafer-shaped article when held by said spin chuck.

13. The apparatus according to claim 12, wherein said at least one vertical fluid discharge nozzle comprises a vertical gas discharge nozzle communicating with a gas supply and a vertical liquid discharge nozzle communicating with a liquid supply.

14. The apparatus according to claim 12, wherein said at least one vertical fluid discharge nozzle has a discharge orifice positioned above said horizontal gas discharge nozzle.

15. The apparatus according to claim 1, further comprising a supply of inert gas connected to said fluid dispensing nozzle and feeding said horizontal gas discharge nozzle.

16. The apparatus according to claim 1, wherein said horizontal gas discharge nozzle comprises a radially outwardly directed annular slit for providing a gas curtain into a gap between said non-rotating plate and a wafer-shaped article when positioned on said spin chuck, in a direction parallel to the non-rotating plate.

17. The apparatus according to claim 1, wherein said predetermined horizontal position is such that a lower surface of a wafer-shaped article when positioned on said spin chuck is spaced from an upper surface of said non-rotating plate by a distance of 1-20 mm.

18. The apparatus according to claim 1, wherein said non-rotating plate is round and positioned coaxially with a wafer-shaped article when held by said spin chuck, said non-rotating plate having a diameter of at least 90% of said predetermined diameter.

19. The apparatus according to claim 1, wherein said horizontal gas discharge nozzle has a diameter of less than 20 mm.

20. Apparatus for treating a wafer-shaped article, comprising:
a spin chuck configured to hold a wafer-shaped article of a predetermined diameter in a predetermined horizontal position;
a non-rotating plate positioned relative to said spin chuck such that said non-rotating plate is beneath and parallel to the wafer-shaped article when positioned on said spin chuck in said predetermined horizontal position;
a heating assembly comprising at least one radiant heating element positioned beneath said non-rotating plate, wherein said non-rotating plate is substantially transparent to radiation emitted by said at least one radiant heating element and said non-rotating plate is disposed between (i) said heating assembly and (ii) said-wafer shaped article when positioned on said spin chuck in said predetermined horizontal position; and
a fluid dispensing nozzle passing through said non-rotating plate and said heating assembly and terminating in a discharge end positioned above and adjacent to said non-rotating plate;
said discharge end comprising a horizontal gas discharge nozzle configured to distribute gas radially outwardly across an upper surface of said non-rotating plate.

21. Apparatus for treating a wafer-shaped article, comprising:
a spin chuck configured to hold a wafer-shaped article of a predetermined diameter in a predetermined horizontal position;
a non-rotating plate positioned relative to said spin chuck such that said non-rotating plate is beneath and parallel to the wafer-shaped article when positioned on said spin chuck in said predetermined horizontal position,
wherein said non-rotating plate is an upper cover of a heating assembly and comprises at least one radiant heating element, and
wherein said non-rotating plate is substantially transparent to radiation emitted by said at least one radiant heating element; and
a fluid dispensing nozzle passing through said non-rotating plate and terminating in a discharge end positioned above and adjacent to said non-rotating plate,
said discharge end comprising a horizontal gas discharge nozzle configured to distribute gas radially outwardly across an upper surface of said non-rotating plate.

22. The apparatus according to claim 21, further comprising a chamber that can be closed in an airtight manner, said spin chuck, said non-rotating plate and said fluid dispensing nozzle being disposed within said chamber.

23. The apparatus according to claim 22, wherein said spin chuck is an annular magnetic rotor comprising downwardly-projecting gripping pins configured to hold a wafer-shaped article such that it hangs downwardly from said annular magnetic rotor.

24. The apparatus according to claim 23, wherein said chamber comprises an upper section and a lower section that is movable vertically relative to said upper section between a first position in which said upper and lower sections are spaced apart from one another, and a second position in which said upper and lower sections sealingly engage one another.

25. The apparatus according to claim 24, wherein said annular magnetic rotor is positioned in said upper section of said chamber and said non-rotating plate and said fluid dispensing nozzle are positioned in said lower section of said chamber.

26. The apparatus according to claim 21, wherein said spin chuck is mounted for rotation about a stationary central post and comprises a series of upwardly-projecting gripping pins configured to hold a wafer-shaped article in said predetermined horizontal position above an upper surface of said spin chuck; said non-rotating plate being mounted on said central stationary post above said upper surface of said spin chuck and below a wafer-shaped article when held in said predetermined horizontal position.

27. The apparatus according to claim 21, wherein said heating assembly comprises at least one infrared heating element.

28. The apparatus according to claim 21, wherein said heating assembly comprises a plurality of LED heating elements.

29. The apparatus according to claim 21, wherein said non-rotating plate is made from quartz.

30. The apparatus according to claim 21, wherein said fluid dispensing nozzle further comprising at least one vertical fluid discharge nozzle for directing another fluid against a wafer-shaped article when held by said spin chuck.

31. The apparatus according to claim 30, wherein said at least one vertical fluid discharge nozzle comprises a vertical gas discharge nozzle communicating with a gas supply and a vertical liquid discharge nozzle communicating with a liquid supply.

32. The apparatus according to claim 30, wherein said at least one vertical fluid discharge nozzle has a discharge orifice positioned above said horizontal gas discharge nozzle.

33. The apparatus according to claim 21, further comprising a supply of inert gas connected to said fluid dispensing nozzle and feeding said horizontal gas discharge nozzle.

34. The apparatus according to claim 21, wherein said horizontal gas discharge nozzle comprises a radially outwardly directed annular slit for providing a gas curtain into a gap between said non-rotating plate and a wafer-shaped article when positioned on said spin chuck, in a direction parallel to the non-rotating plate.

35. The apparatus according to claim 21, wherein said predetermined horizontal position is such that a lower surface of a wafer-shaped article when positioned on said spin chuck is spaced from an upper surface of said non-rotating plate by a distance of 1-20 mm.

36. The apparatus according to claim 21, wherein said non-rotating plate is round and positioned coaxially with a wafer-shaped article when held by said spin chuck, said non-rotating plate having a diameter of at least 90% of said predetermined diameter.

37. The apparatus according to claim 21, wherein said horizontal gas discharge nozzle has a diameter of less than 20 mm.

* * * * *

UNITED STATES PATENT AND TRADEMARK OFFICE
CERTIFICATE OF CORRECTION

PATENT NO. : 9,887,122 B2  
APPLICATION NO. : 15/148778  
DATED : February 6, 2018  
INVENTOR(S) : Hongbo Si et al.

Page 1 of 1

It is certified that error appears in the above-identified patent and that said Letters Patent is hereby corrected as shown below:

In the Claims

In Claim 1  
Column 6, Line 12     Delete "elected" and insert -- ejected --  
Column 6, Line 12     Delete "qas" and insert -- gas --

Signed and Sealed this  
Fifth Day of May, 2020

Andrei Iancu  
*Director of the United States Patent and Trademark Office*